(12) United States Patent
Lo et al.

(10) Patent No.: US 8,477,632 B2
(45) Date of Patent: Jul. 2, 2013

(54) ANTENNA TESTING DEVICE

(75) Inventors: Yuan-Hong Lo, Taoyuan (TW);
Kuan-Chi Liao, Taoyuan (TW);
De-Hung Wang, Taoyuan (TW);
Yu-Ting Chen, Taoyuan (TW); Yi-Hsien Weng, Taoyuan (TW); Jhao-Yang Li, Taoyuan (TW)

(73) Assignee: FIH (Hong Kong) Limited, Kowloon (HK)

( * ) Notice: Subject to any disclaimer, the term of this patent is extended or adjusted under 35 U.S.C. 154(b) by 528 days.

(21) Appl. No.: 12/771,228

(22) Filed: Apr. 30, 2010

(65) Prior Publication Data

US 2011/0069617 A1  Mar. 24, 2011

(30) Foreign Application Priority Data

Sep. 18, 2009 (TW) .............................. 98131543 A

(51) Int. Cl.
*H04L 1/00* (2006.01)
*H04L 12/26* (2006.01)
*H04B 11/00* (2006.01)

(52) U.S. Cl.
USPC ............................ 370/241; 370/247; 370/278

(58) Field of Classification Search
USPC ........................................................ 370/241
See application file for complete search history.

(56) References Cited

U.S. PATENT DOCUMENTS

| | | | |
|---|---|---|---|
| 6,879,831 B2 * | 4/2005 | Hamabe | 455/442 |
| 2007/0032832 A1 * | 2/2007 | Feher | 607/32 |
| 2008/0013639 A1 * | 1/2008 | Rick et al. | 375/260 |
| 2008/0214135 A1 * | 9/2008 | Muhammad | 455/296 |
| 2010/0277289 A1 * | 11/2010 | Brauner et al. | 340/10.51 |

\* cited by examiner

*Primary Examiner* — Steven H Nguyen
*Assistant Examiner* — Abu-Sayeed Haque
(74) *Attorney, Agent, or Firm* — Altis Law Group, Inc.

(57) ABSTRACT

An antenna testing device for testing an antenna assembled in a portable wireless communication device includes a data processing unit configured to receive signals from a CPU of the portable wireless communication device, a feedback unit, and a duplexer. The data processing unit sends the signals to the antenna by the feedback unit and the duplexer. The feedback unit feeds back mixed feedback signals mixed with signals leaked from the antenna to the data processing unit. The data processing unit judges whether the antenna is working properly according to the mixed feedback signals.

6 Claims, 2 Drawing Sheets

ANTENNA TESTING DEVICE

BACKGROUND

1. Technical Field

The disclosure generally relates to antenna testing devices, particularly to a testing device for testing an antenna in a portable wireless communication device.

2. Description of Related Art

With the developments of wireless communication and information processing technologies, portable wireless communication devices such as mobile phones and personal digital assistants (PDAs) are now in widespread use. Antennas are important components of the portable wireless communication devices used for transmitting/receiving signals. Therefore, testing the antenna after it has been assembled in a device is important during the manufacture of portable wireless communication devices. However, conventional testing devices are usually complex and costly.

Therefore, there is room for improvement within the art.

BRIEF DESCRIPTION OF THE DRAWINGS

Many aspects of the antenna testing device can be better understood with reference to the following drawings. The components in the drawings are not necessarily drawn to scale, the emphasis instead being placed upon clearly illustrating the principles of the antenna testing device.

DETAILED DESCRIPTION

Figure 1:
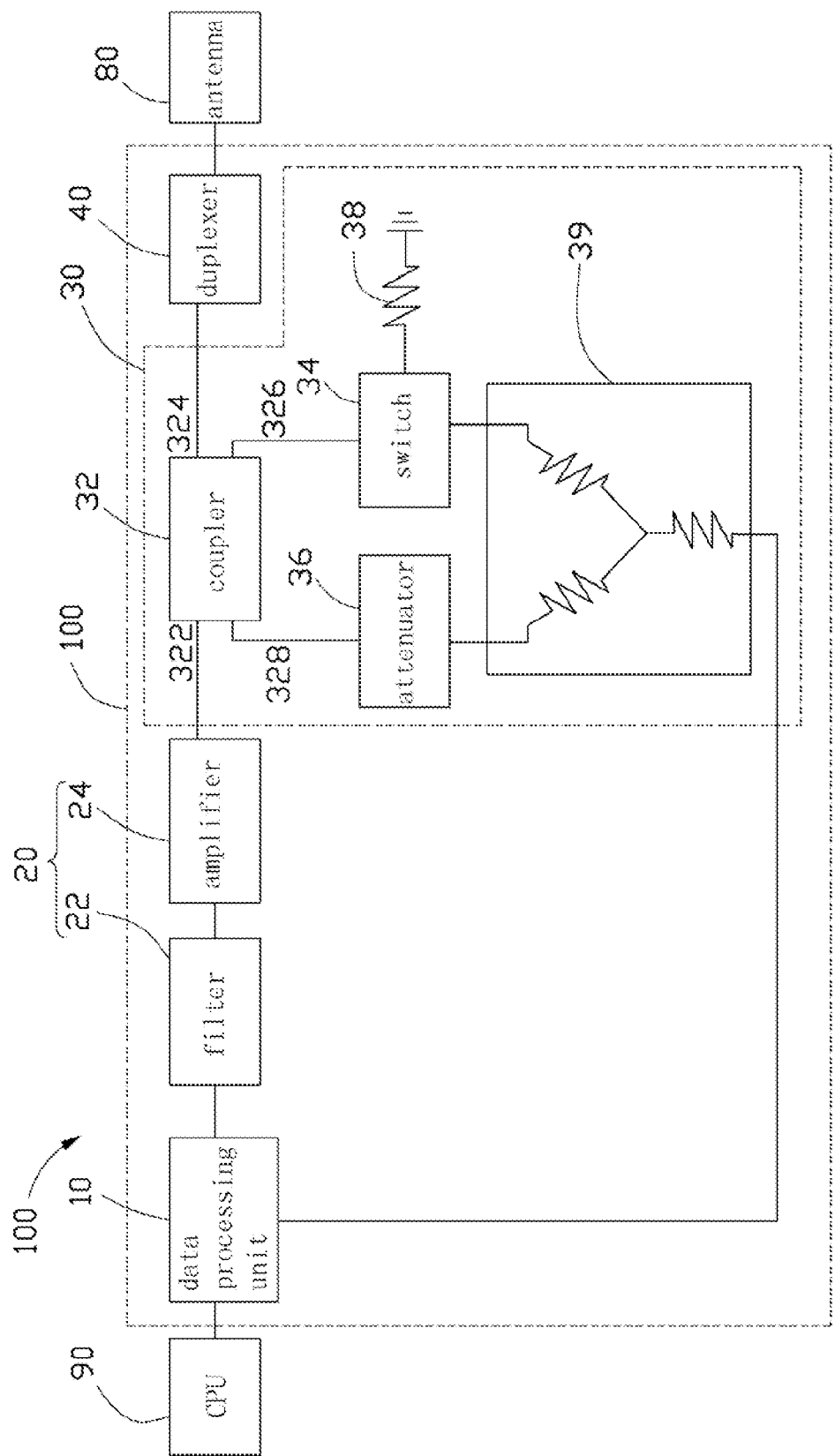
FIG. 1 is a block diagram of an antenna testing device for testing an antenna assembled in a portable wireless communication device, according to an exemplary embodiment.

Referring to FIG. 1, an exemplary embodiment of an antenna testing device 100 for testing an antenna 80 assembled in a portable wireless communication device includes a data processing unit 10, an adjusting unit 20, a feedback unit 30, and a duplexer 40. The data processing unit 10, the adjusting unit 20, the signal feedback unit 30, and the duplexer 40 are connected in series. Also, the signal feedback unit 30 is connected to the data processing unit 10.

The data processing unit 10 connects to a central processing unit (CPU) 90 of the portable wireless communication device having the antenna 80. The data processing unit 10 receives signals from the CPU such as those that would be generated for wireless communication, and then sends the signals to the antenna 80 by the adjusting unit 20, the feedback unit 30, and duplexer 40. Also, the data processing unit 10 receives corresponding feedback signals from the feedback unit 30 and judges whether the antenna 80 is working properly according to the feedback signals.

The adjusting unit 20 includes a filter 22 and an amplifier 24 connected to the filter 22. The filter 22 may be a surface acoustic wave filter. The filter 22 receives the signals from the data processing unit 10 and reduces noise in the signals. The amplifier 24 receives signals from the filter 22, and amplifies the signals.

The feedback unit 30 includes a coupler 32, an attenuator 36, and a switch 34. The coupler 32 includes a first contact 322, a second contact 324, a third contact 326, and a fourth contact 328. The first contact 322 is connected to the amplifier 24. The second contact 324 is connected to the duplexer 40. The third contact 326 is connected to the switch 34. The fourth contact 328 is connected to the attenuator 36. The coupler 32 receives adjusted signals from the adjusting unit 20 by the first contact 322, and then sends the adjusted signals to the duplexer 40 by the second contact 324, and the attenuator 36 by the fourth contact 328. The coupler 32 also receives signals from the duplexer 40 by the second contact 324, and then sends the received signals to the third contact 326. The attenuator 36 attenuates the adjusted signals and forms first feedback signals. In addition, if the antenna 80 is not working properly, e.g., from incorrect assembly, there may be signal leaked from the antenna 80 transmitted back to the third contact 326 by the duplexer 40, and the second contact 324, forming second feedback signals.

One end of the switch 34 is connected the third contact 326 of the coupler 32, another end of the switch 34 is selectively connected to ground by a matching resistor 38 or connected to the resistor unit 39. The resistance value of the matching resistor 38 in this embodiment is 50 ohms. When the switch 34 is selected to connect the third contact 326 of the coupler 32 to ground, the antenna testing device 100 works in a signal transmitting mode, the signals adjusted by the adjusting unit 24 are sent to the antenna 80 by the first contact 322, the second contact 324 of the coupler 32, and the duplexer 40. Also, the signals adjusted by the adjusting unit 20 are attenuated by the attenuator 36, and fed back to the data processing unit 10 by the fourth contact 328, and the resistor unit 39 as the first feedback signals. When the switch 34 is selected to connect the third contact 326 of the coupler 32 to the resistor unit 39, the antenna testing device 100 works in a test mode, the second feedback signals and the first feedback signals are mixed and fed back to the data processing unit 10.

The resistor unit 39 includes three resistors having equal resistance value. The sum of the resistance of the three resistors is equal to that of the matching resistor 38, and resistance value of each resistor is 16.7 ohms in this embodiment. One end of the three resistors are connected together, another end of the three resistors are respectively connected to the switch 34, the attenuator 36, and the data process unit 10. The resistor unit 39 is configured to enhance isolation between the third contact 326 and the fourth contact 328. The duplexer 40 is configured to transmit signals between the feedback unit 30 and antenna 80.

Figure 2:
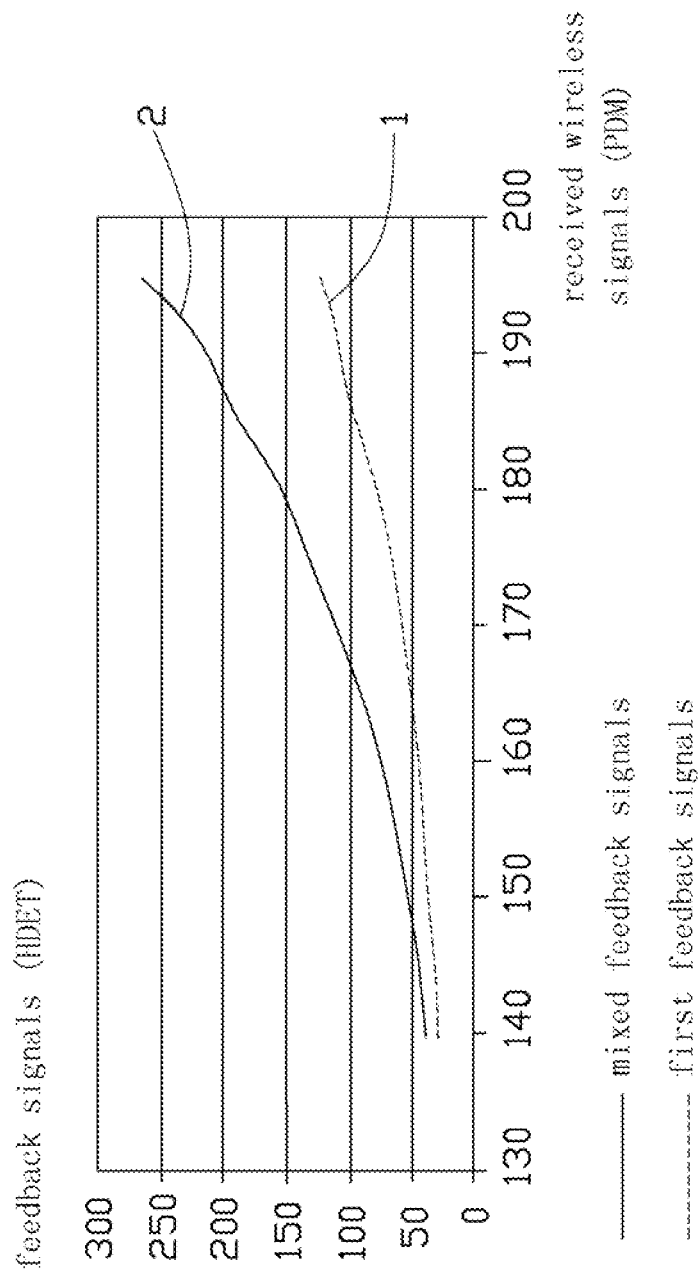
FIG. 2 is a test graph obtained from the antenna testing device of FIG. 1, disclosing strengths of first feedback signals and mixed feedback signals varying with signals received from a CPU of a portable wireless communication device.

During testing, firstly, the data processing unit 10 is connected to the CPU 90 of the portable wireless device, and the duplexer 40 is connected to the antenna 80. The data processing unit 10 receives signals from the CPU 90, and then sends the signals to the adjusting unit 20. The adjusting unit 20 adjusts the signals, and sends the adjusted signals to the signal feedback unit 32. Then, the switch 34 is selected to connect the third contact 326 to ground, the adjusted signals are sent to the antenna 80 by the first contact 322, the second contact 324 of the coupler 32, the duplexer 40, and also are attenuated by the attenuator 34, and fed back to the data processing unit 10 by the resistor unit 39 as the first feedback signals. After that, the switch 34 is selected to connect the third contact 326 to the resistor unit 39, the mixed feedback signals are fed back to the data processing unit 10. Finally, the data processing unit 10 obtains the second feedback signals by eliminating the first feedback signals in the mixed feedback signals, and judges whether the antenna is working properly according to the second feedback signals. Referring to FIG. 2, curves 1 and curves 2 respectively represent the strength of the mixed feedback signals and the first feedback signals.

In other embodiments, the switch 34 can be omitted, the third contact 326 of the coupler 32 is connected to the resistor unit 39. The data processing unit 10 judges whether the antenna is working properly according to the mixed feedback signal.

In addition, a reference signal strength of the first feedback signals can be predetermined in the data processing unit 10. The data processing unit 10 can judge whether the signals sent to the antenna 80 are stable by comparing the first feedback signals with the reference signals, and adjusts strength of the signal to be suitable for the antenna 80 according to the comparison. For example, if the strength of the first feedback signal is weaker than the predetermined reference signals, the data processing unit 10 enhances strength of the signals. If the strength of the first feedback signal is higher than the predetermined signal, the data processing unit 10 weakens the strength of signals.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An antenna testing device for testing an antenna assembled in a portable wireless communication device; the antenna testing device comprising:
    a data processing unit configured to receive signals from a CPU of the portable wireless communication device;
    a feedback unit; and
    a duplexer; wherein the data processing unit sends the signals to the antenna by the feedback unit and the duplexer; the feedback unit feeds back mixed feedback signals mixed with signals leaked from the antenna to the data processing unit; the data processing unit judges whether the antenna is working properly according to the mixed feedback signals; the feedback unit comprises a coupler, a resistor unit, an attenuator and a switch; the coupler includes a first contact connected to the data processing unit, a second contact connected to the duplexer, a third contact, and a fourth contact; the attenuator is connected to the fourth contact and the resistor unit; the resistor unit is connected to the data processing unit; one end of the switch is connected the third contact of the coupler, another end of the switch is selectively connected to ground or the resistor unit; when the another end of the switch is selected to connect to ground, first feedback signals are fed back to the data processing unit by the attenuator; when the another end of the switch is selected to connect to the resistor unit, the mixed feedback signals mixed with signals leaked from the antenna to the data processing unit and the first feedback signals are fed back to the data processing unit.

2. The antenna testing device as claimed in claim 1, wherein the data processing unit judges whether the signals sending to the antenna is stable according to the first feedback signals, and adjusts strengths of the signal to be suitable for the antenna.

3. The antenna testing device as claimed in claim 1, wherein the switch selectively connects to the third contact of the coupler to ground by a matching resistor.

4. The antenna testing device as claimed in claim 3, wherein the resistor unit includes three resistors having an equal resistance value, the sum of the resistance of the three resistors is equal to that of the matching resistor, one end of the three resistors are connected together, another end of the three resistors are respectively connected to the attenuator, the switch, and the data process unit.

5. The antenna testing device as claimed in claim 1, further including an adjusting unit set between the data processing unit and the feedback unit, wherein the adjusting unit includes a filter and an amplifier and configured to adjust the signals.

6. The antenna testing device as claimed in claim 5, wherein the filter is a surface acoustic wave filter.

* * * * *